(12) United States Patent
Andres

(10) Patent No.: US 6,816,092 B2
(45) Date of Patent: Nov. 9, 2004

(54) METHOD AND CIRCUIT ARRANGEMENT FOR ENCODING AND DECODING DATA

(75) Inventor: Joerg Andres, Neustadt (DE)

(73) Assignee: Sennheiser electronic GmbH & Co.KG, Wedemark (DE)

(*) Notice: Subject to any disclaimer, the term of this patent is extended or adjusted under 35 U.S.C. 154(b) by 0 days.

(21) Appl. No.: 10/461,233

(22) Filed: Jun. 13, 2003

(65) Prior Publication Data

US 2004/0008792 A1 Jan. 15, 2004

(30) Foreign Application Priority Data

Jun. 14, 2002 (DE) ......................... 102 26 548

(51) Int. Cl.⁷ ............................................. H03M 7/00
(52) U.S. Cl. .................................. 341/50; 341/51
(58) Field of Search ........................... 341/50, 51, 67; 375/371; 327/3

(56) References Cited

U.S. PATENT DOCUMENTS 6,295,272 B1    9/2001   Feldman et al. ............ 370/210
6,301,318 B1 *  10/2001  Wei et al. .................... 375/371

FOREIGN PATENT DOCUMENTS

DE     100 48 352    4/2002    ........... H04L/25/20

* cited by examiner

Primary Examiner—Brian Young
Assistant Examiner—Joseph Lauture
(74) Attorney, Agent, or Firm—Reed Smith LLP

(57) ABSTRACT

The invention is directed to a method for encoding data of a data signal by a periodic synchronous signal having at least two signal levels in a baseband signal. To provide a possibility by which the data of the synchronous signal can be encoded and decoded again in a simple and economical manner without having to employ the expensive hardware used in known methods, it is proposed, according to the invention, that the baseband signal is generated by combining the data signal and the synchronous signal, this combining step being carried out in such a way that, depending on the signal level of the synchronous signal, the signal level of the baseband signal lies in an associated level range independent from the data signal. The invention is also directed to a corresponding method for decoding a baseband signal and corresponding circuit arrangements. The method is preferably used for encoding and decoding audio signals.

13 Claims, 4 Drawing Sheets

METHOD AND CIRCUIT ARRANGEMENT FOR ENCODING AND DECODING DATA

CROSS-REFERENCE TO RELATED APPLICATION

This application claims priority of German Application No. 102 26 548.8, filed Jun. 14, 2002, the complete disclosure of which is hereby incorporated by reference.

BACKGROUND OF THE INVENTION a) Field of the Invention

The invention is directed to a method for encoding data of a data signal by means of a synchronous signal in a baseband signal. The invention is further directed to a circuit arrangement for implementing this encoding. The invention is further directed to a method for recovering the synchronous signal from the baseband signal and for decoding the data from the baseband signal and to a corresponding circuit arrangement.

b) Description of the Related Art

Various known equipment such as stereo audio AD converters and codecs, for example, generate a digital data signal from, e.g., two analog input channels and generate a corresponding synchronous signal. The synchronous signal, designated, e.g., as WCL (Word Clock), contains the channel information and is output correspondingly synchronous with the data signal.

A prior code is needed for transferring or transmitting the data. FIG. 1 shows a typical baseband data format for multichannel digital transfer processes. In this case, the bits are transferred in frames. These frames contain the data bits as well as information bits. The data bits contain the actual data. The information bits can have diverse functions. In every case, however, synchronous information for the frames is transferred in them.

Other known methods split the data into small packets and encode these partial data in expanded formats, e.g., 16 bits in 4×4 bit packets, each with an additional bit. This results in 4×5 bit packets. Synchronous information can be impressed on the resulting data stream in this case too by suitable encoding.

In known methods, the encoding and decoding of the data is carried out digitally in principle. Therefore, for recovery of timing and data, known methods require either a processor or DSP or at least arithmetic element hardware such as ASICs or FPGAs. For this reason, conversion in the known methods is very expensive.

It is the object of the invention to provide a possibility by which the data and synchronous signal can be encoded and decoded again in a simple and economical manner, so that the expensive hardware used previously can be eliminated as far as possible.

This object is met according to the invention by a method for encoding data of a data signal by means of a periodic synchronous signal having at least two signal levels in a baseband signal, the baseband signal being generated by combining the data signal and the synchronous signal, this combining step being carried out in such a way that, depending on the signal level of the synchronous signal, the signal level of the baseband signal lies in an associated level range independent from the data signal.

Instead of digital encoding in determined data formats, the invention mixes the data signal and synchronous signal. Accordingly, the data and the synchronous information are contained in one signal without subdividing sequentially into different blocks. The mixing for encoding and the subsequent decoding can be carried out in analog in a simple manner.

The data signal and the associated synchronous signal are preferably prepared by known devices, e.g., stereo audio AD converters. The combination of the two signals can be carried out, e.g., by weighted addition. Other possibilities for combining are subtraction or multiplication of the two signals.

When the synchronous signal has only two signal levels, the combining step can be carried out, e.g., by weighted addition, in such a way that the signal level of the generated baseband signal lies above or below a reference level depending on the signal level of the synchronous signal. The synchronous signal can be detected immediately based on the position of the baseband signal generated in this way in relation to the reference level.

In addition, it is provided in another arrangement of the invention that the data signal is inverted before the combining step depending on the synchronous signal, this inversion being carried out only at one of the two signal levels of the synchronous signal. In this way, a certain symmetry is achieved between the generated baseband signal and reference level.

The conversion of the method according to the invention is carried out by means of a circuit arrangement for encoding data of a data signal by means of a periodic synchronous signal having at least two signal levels in a baseband signal with a combining unit for combining the data signal and the synchronous signal to form the baseband signal in such a way that, independent from the data signal, the level of the baseband signal lies in an associated level range depending on the signal level of the synchronous signal. The combining unit can be formed of operational amplifiers or transistor circuits, for example.

The data signal and the synchronous signal are generally voltage signals. For every range of the synchronous signal, which is usually indicated by the change in voltage amplitude, there is a range of the data signal associated with it. The combining operation carries out a kind of overlapping of the signals which is effected in such a way that the ranges of the synchronous signal are still discernible after the overlapping.

In a preferred construction of the circuit arrangement, the combining unit is formed as a voltage divider for weighted addition. In this connection, the resistors forming the voltage divider are dimensioned such that the synchronous signal is weighted more highly than the data signal in the addition. In this way, it is achieved that the resulting baseband signal lies above or below the reference voltage depending on the voltage level of the synchronous signal.

In another advantageous development of the circuit arrangement that also uses a voltage divider, the voltage level in the voltage divider is raised by an additional voltage source, preferably with half of the voltage amplitude of the synchronous signal or data signal. The reference voltage of the reference level can be fixed by means of this additional voltage source. When the additional voltage source has half of the voltage amplitude of the synchronous signal or data signal, the voltage amplitude of the reference level corresponds to the amplitude of the additional voltage source.

When the synchronous signal has two signal levels and the combining operation is carried out by means of weighted addition, the data signal can be combined additionally with the synchronous signal prior to the weighted addition by means of an exclusive-OR element. In this way it is achieved that the resulting baseband signal is mirror-symmetric to the reference level.

The recovery of the synchronous signal and data signal is carried out, according to the invention, by a method for decoding a baseband signal in which data are encoded using the method according to the invention, wherein by comparing the baseband signal to one or more reference levels, its level range is determined, wherein the signal level of a periodic synchronous signal having at least two signal levels is determined from this, and wherein the data are recovered by means of combining the determined synchronous signal with the baseband signal. By means of this method, the encoding of the baseband signal is successively undone or canceled. Therefore, the ranges in which the baseband signal is found are determined initially. The original synchronous signal can be immediately detected from this. The data can now be extracted from the baseband signal by means of the recovered synchronous signal.

When the original synchronous signal has only two signal amplitudes, an arrangement of the method can be applied whereby the synchronous signal is recovered by comparing the baseband signal to a reference level and the data are recovered by comparing the baseband signal to the signal level of the synchronous signal. In this method, the synchronous signal can be recovered in a simple manner. In this case, it is only necessary to determine whether the baseband signal is above or below a reference level. The baseband signal can then be shifted in amplitude, for example, by means of the recovered synchronous signal, as a function of the synchronous signal depending on the encoding process that is used, so that the data signal results.

The recovery of the data is carried out by means of a circuit arrangement for decoding a baseband signal in which data are encoded using the method according to the invention, with a comparison unit for comparing the baseband signal to one or more reference levels for determining the synchronous signal with a combining unit for combining the baseband signal with the synchronous signal for recovery of the data. The baseband signal can be compared to one or more levels in the comparison unit in order to determine the range in which the baseband signal is located. The synchronous signal results directly from the ranges found in this way. The comparison unit can be formed by one or more operational amplifiers or transistors, for example.

The combining unit decodes the data from the baseband signal by means of the recovered synchronous signal. Also, the combining unit can be formed of operational amplifiers or transistor circuits. When the circuit arrangement decodes by undoing a weighted addition, for example, the recovered synchronous signal can form a variable reference level by means of a voltage divider. The baseband signal can be directly compared to the variable reference level by an operational amplifier and the addition can accordingly be undone. This results directly in the data signal.

In a preferred construction there is an RC series connection at the input of the circuit arrangement. A shifting of the baseband signal is achieved by means of this RC series connection. When the baseband signal is arranged mirror-symmetric to a reference level, the RC circuit achieves a shifting of the baseband signal in such a way that the reference level is shifted to null.

In another construction, the circuit arrangement for decoding is characterized in that a lowpass filter is arranged in front of the comparison unit and the baseband signal is fed through this lowpass filter. In case this circuit arrangement also has an RC circuit, the lowpass filter is arranged in front of this RC circuit. Since noise is to be expected when transferring the baseband signal, a lowpass filter can be required for filtering out this noise.

In another construction, the circuit arrangement for decoding can be characterized in that the determined synchronous signal and the determined data signal are combined additionally by means of an exclusive-OR element. The exclusive-OR element is required in the circuit for decoding when an exclusive-OR element has already been used in the circuit for encoding. A second combining operation of the data signal with the synchronous signal by means of an exclusive-OR element directly undoes the first combining operation with the exclusive-OR element.

The invention will be described more fully in the following with reference to the drawings.

DESCRIPTION OF THE PREFERRED EMBODIMENTS

Figure 1:
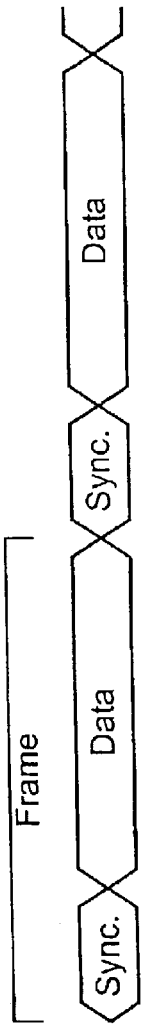
FIG. 1 shows a typical baseband data format for multichannel digital transfer methods.

FIG. 1 shows a typical known baseband format for multichannel digital transfer processes. In this case, the bits are transferred in frames. These frames contain the data bits (Data) and, additionally, also information bits (Sync.). The data bits contain the actual data. The information bits can have diverse functions. In every case, however, synchronous information for the frames is transferred in them.

Figure 2:
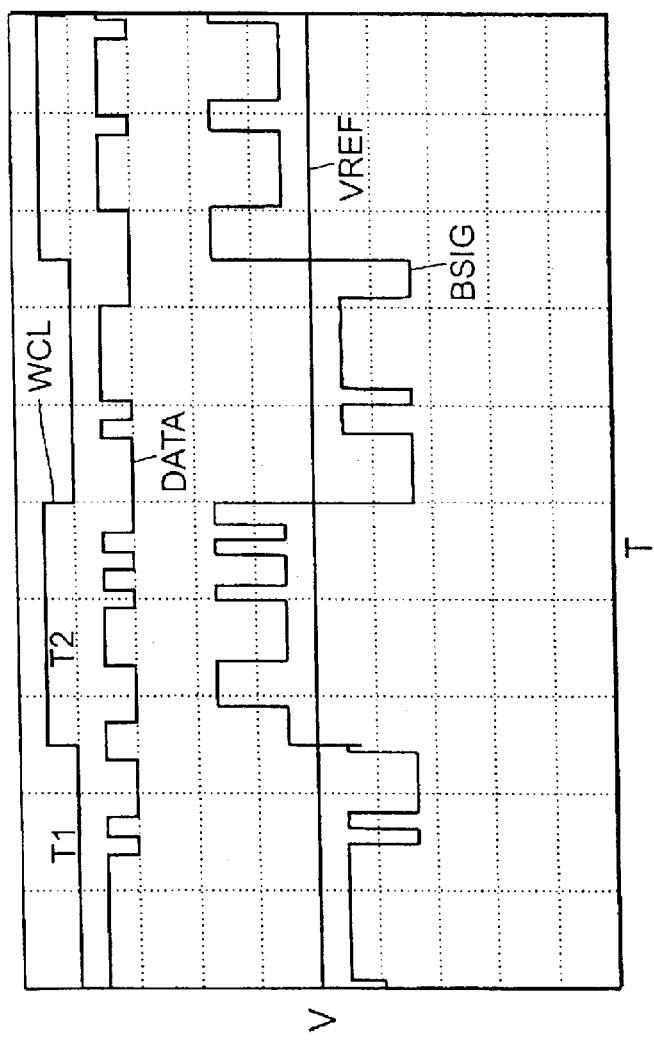
FIG. 2 shows a typical waveform when using encoding according to the invention.

FIG. 2 shows data signals to illustrate the encoding process according to the invention. A typical synchronous signal WCL has a low signal level T1 alternating with a high signal level T2. The data signal DATA contains random data. Further, a reference level VREF is shown in this Figure. The encoded baseband signal BSIG lies below or above the reference level VREF depending on the level of the synchronous signal WCL. It should be noted that in this illustration the data signal DATA as well as the synchronous signal WCL are shifted in amplitude relative to the reference level VREF and baseband signal BSIG. When the synchronous signal WCL has a low signal level at T1, the encoded baseband signal BSIG lies below the reference level VREF. Further, it can be seen in this range that the baseband signal BSIG corresponds in principle to the data signal DATA. At a high level T2 of the synchronous signal WCL, the baseband signal BSIG lies above the reference level VREF. Further, it can be seen in this case that the baseband signal BSIG and data signal DATA mirror one another. In another possible embodiment form of the method, the data signal DATA is not mirrored. In every case, as is shown in this Figure, the low level range T1 and the high level range T2 of the synchronous signal WCL can be seen from this baseband signal BSIG.

In a preferred implementation of the encoding, a synchronous signal WCL and a data signal DATA are available as input signals. In the encoding shown in FIG. 2, the data signal DATA is inverted at every high level T2 of the synchronous signal WCL. In a next step, the synchronous signal WCL is added with weighting to the data signal that has changed in this way. In so doing, the synchronous signal WCL is more weighted, so that the resulting baseband signal BSIG lies above or below the reference level VREF depending on the signal level of the synchronous signal CL.

Figure 3:
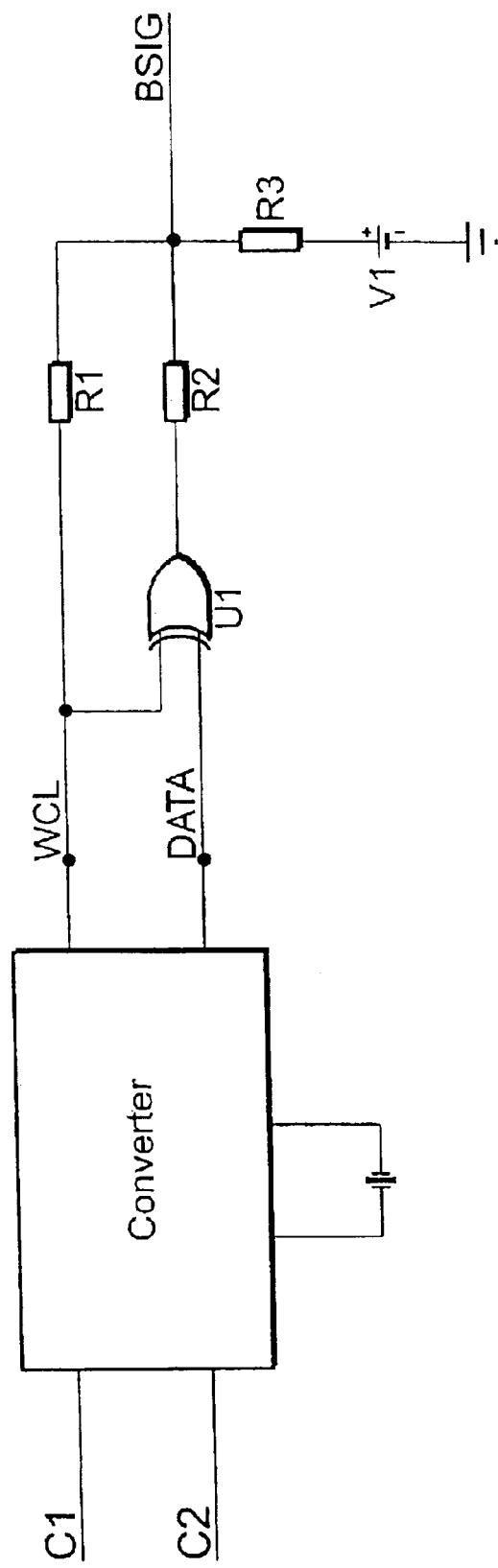
FIG. 3 shows an embodiment form of a circuit arrangement, according to the invention, for encoding data.

FIG. 3 shows a preferred embodiment form of a circuit arrangement according to the invention for encoding data DATA in a baseband signal BSIG. In this case, technical equipment, e.g., a stereo audio AD converter, generates a data signal DATA and a synchronous signal WCL from two analog input channels C1, C2. The data signal DATA is combined with the synchronous signal WCL by a combining unit U1. This combining unit U1 can be, for example, an exclusive-OR element or an exclusive-OR element with inverting element arranged in front of or after it. It is also possible to omit the combining unit U1 in this location. The synchronous signal WCL and the data signal DATA are carried out in this case as voltage signals. They are given to the voltage divider formed by the three resistors R1, R2, R3. The encoded baseband signal results directly at the junction between the three resistors R1, R2, R3. The signal level of the baseband signal BSIG can be raised directly by the additional voltage source V1. In a preferred embodiment form, this additional voltage source V1 has half of the voltage amplitude of the synchronous signal WCL and data signal DATA. However, other voltage amplitudes, e.g., also zero voltage amplitude, are also possible for this voltage source V1.

Figure 4:
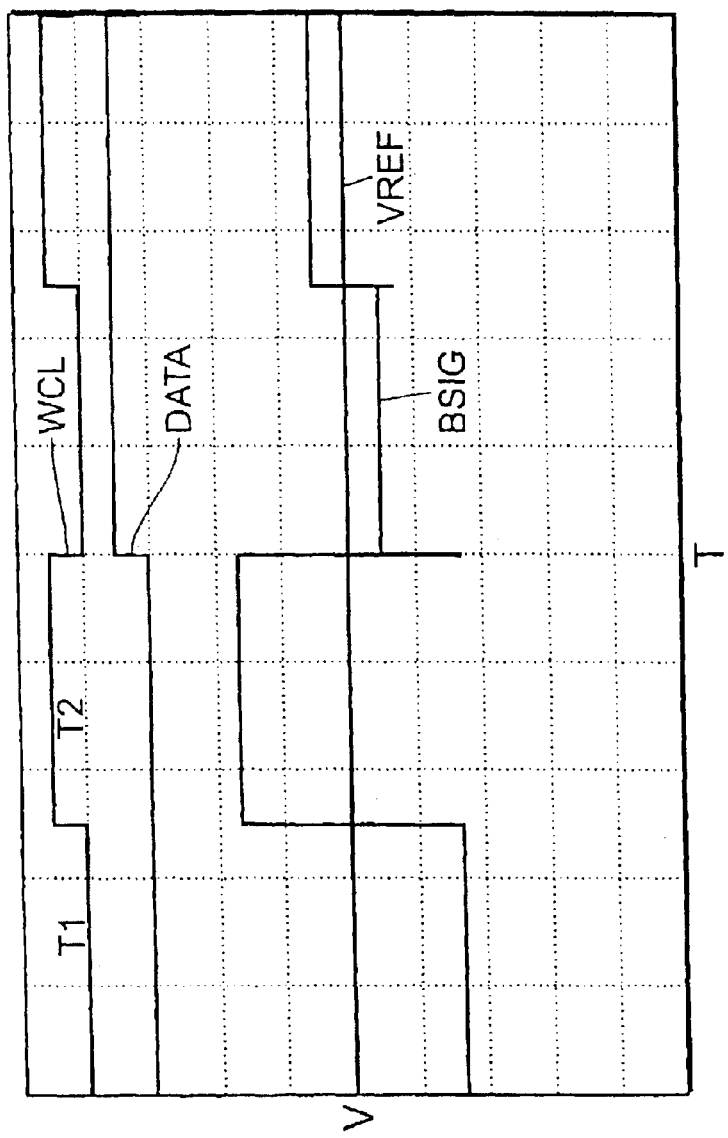
FIG. 4 shows a waveform to illustrate the symmetry effect of a circuit arrangement, according to the invention, for encoding data.

FIG. 4 shows waveforms like those in FIG. 2. The difference is that the data signal DATA in this Figure does not contain any random data. The data signal DATA has a low signal level for a period of the synchronous signal WCL and a high signal level for the next period. It can be seen that the baseband signal BSIG lies above or below the reference signal level VREF depending on the synchronous signal WCL. However, the quantitative distance between the baseband signal BSIG and the reference level VREF remains equal while the level of the data signal DATA remains unchanged. In this preferred embodiment form of the encoding method according to the invention, a symmetric formation of the baseband signal BSIG is also achieved when the data signal DATA is at a constant value. This can be the case, e.g., when no data is being transferred.

Figure 5:
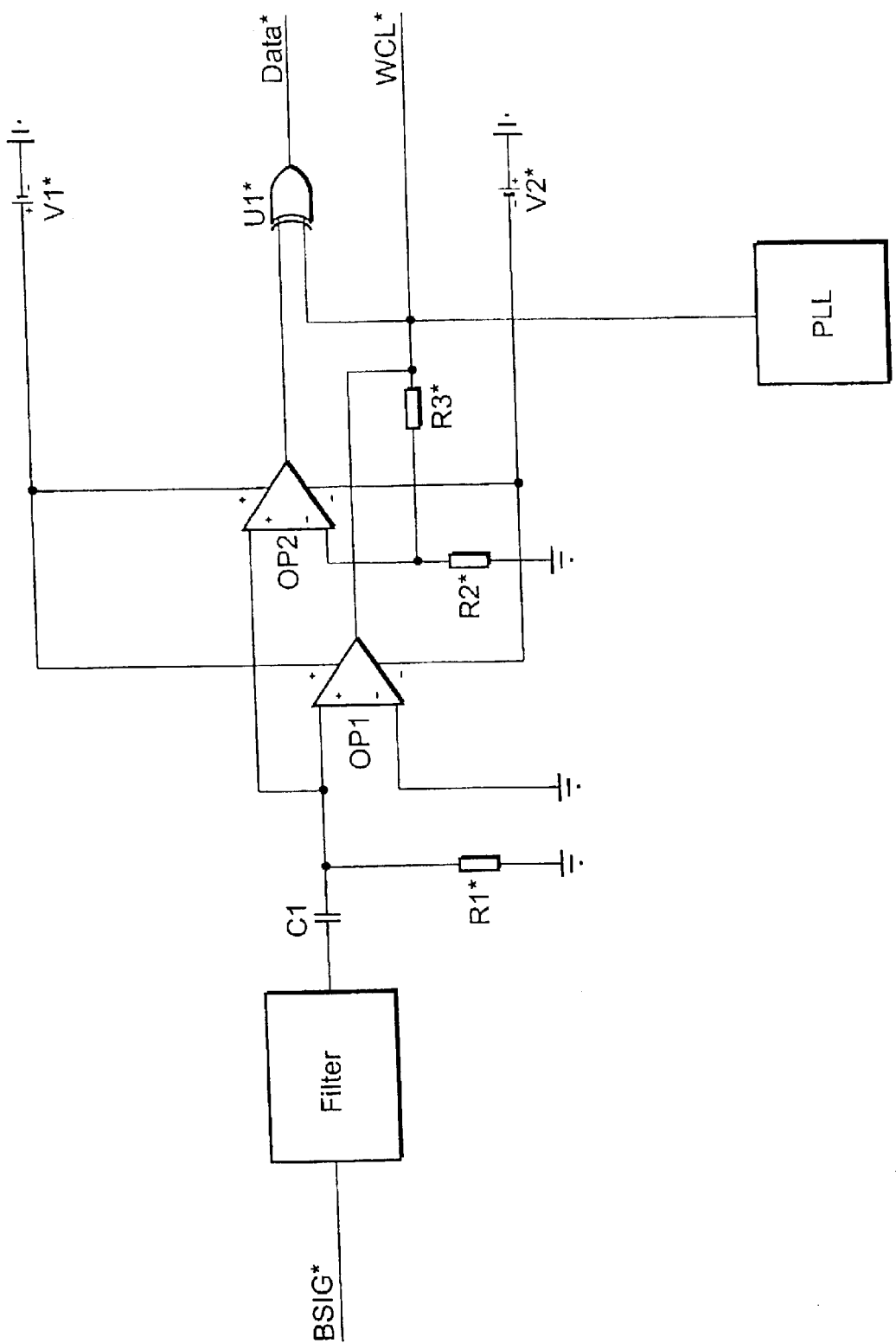
FIG. 5 shows an embodiment form of a circuit arrangement for decoding a baseband signal.

FIG. 5 shows a preferred embodiment form of a circuit arrangement according to the invention for decoding data. The transmitted baseband signal BSIG* forms the input signal for this decoding circuit arrangement. The transmitted signal BSIG* is advantageously fed via a lowpass filter FILTER for suppressing signal noise. However, the filter can be omitted at low noise levels. Together with the resistor R1*, the capacitor C1 arranged downstream causes the reference level of the symmetrically transmitted baseband signal BSIG* to be shifted toward zero. The operational amplifier OP1 compares the transferred and shifted baseband signal BSIG* to zero. The recovered synchronous signal WCL* results directly from a high gain of the operational amplifier OP1. Instead of the operational amplifier OP1, other elements, e.g., transistor circuits, are also possible. The recovered synchronous signal WCL* is given to the input of the second operational amplifier OP2 by a voltage divider which is formed by two resistors R3*, R2*. The shifted baseband signal BSIG* is applied to the other input of the second operational amplifier OP2. The recovered data signal DATA* results directly from comparing to the changing levels at the other input of the second operational amplifier OP2.

The two operational amplifiers OP1, OP2 are supplied by the two voltage sources V1*, V2*. Instead of the second operational amplifier OP2, a transistor circuit is also possible. The combining unit U1 * undoes the combining operation that was carried out by combining unit U1 according to FIG. 3. The clocks required for the DA conversion of the data are obtained by means of a PLL circuit whose phase comparison is carried out with the recovered synchronous signal WCL*.

While the foregoing description and drawings represent the present invention, it will be obvious to those skilled in the art that various changes may be made therein without departing from the true spirit and scope of the present invention.

What is claimed is:

1. A method of encoding data of a data signal comprising:
using a periodic synchronous signal having at least two signal levels in a baseband signal; and
said baseband signal being generated by combining the data signal and the synchronous signal;
said combining step being carried out in such a way that, depending on the signal level of the synchronous signal, the signal level of the baseband signal lies in a level range associated to the signal level of the synchronous signal and is dependent on the signal level of the synchronous signal but independent from the data signal.

2. The method according to claim 1, wherein the combining step is carried out by weighted addition.

3. The method according to claim 1, wherein the synchronous signal has two signal levels and the signal level of the generated baseband signal lies above or below a reference level depending on the signal level of the synchronous signal.

4. The method according to claim 3, wherein the data signal is inverted as a function of the synchronous signal prior to the combining step, wherein the inversion is carried out at only one of the two signal levels of the synchronous signal.

5. A method for decoding a baseband signal in which data are encoded using the method according to claim 1, wherein by comparing the baseband signal to one or more reference levels, its level range is determined, wherein the signal level of a periodic synchronous signal having at least two signal levels is determined from this, and wherein the data are recovered by means of combining the determined synchronous signal with the baseband signal.

6. The method according to claim 5, wherein the synchronous signal is recovered by comparing the baseband signal to a reference level and the data are recovered by comparing the baseband signal to the signal level of the synchronous signal.

7. A circuit arrangement for decoding a baseband signal in which data are encoded using the method according to claim 1, comprising a comparison unit for comparing the baseband signal to one or more reference levels for determining the synchronous signal with a combining unit for combining the baseband signal with the synchronous signal for recovery of the data.

8. The circuit arrangement according to claim 7, wherein a lowpass filter is arranged in front of the comparison unit and the baseband signal is fed through this lowpass filter.

9. The circuit arrangement according to claim 7, wherein the determined synchronous signal and the determined data signal are combined additionally by an exclusive-OR element.

10. A circuit arrangement for encoding data of a data signal comprising:

a periodic synchronous signal having at least two signal levels being provided in a baseband signal; and combining unit for combining the data signal with the synchronous signal to form a baseband signal in such a way that, depending on the signal level of the synchronous signal, the level of the baseband signal lies in a level range associated to the signal level of the synchronous signal and is dependent on the signal level of the synchronous signal but independent from the data signal.

11. The circuit arrangement according to claim 10, wherein the combining unit is formed as a voltage divider for weighted addition.

12. The circuit arrangement according to claim 11, wherein the voltage level in the voltage divider is raised by an additional voltage source, preferably with half of the voltage amplitude of the synchronous signal or data signal.

13. The circuit arrangement according to claim 10, wherein the data signal is combined additionally with the synchronous signal prior to the weighted addition by means of an exclusive-OR element.

* * * * *